United States Patent [19]

Bartlett et al.

[11] 4,170,492
[45] Oct. 9, 1979

[54] METHOD OF SELECTIVE OXIDATION IN MANUFACTURE OF SEMICONDUCTOR DEVICES

[75] Inventors: Keith G. Bartlett, Houston; Laurence R. Jordan, Sugarland; Randall S. Mundt, Houston, all of Tex.

[73] Assignee: Texas Instruments Incorporated, Dallas, Tex.

[21] Appl. No.: 897,318

[22] Filed: Apr. 18, 1978

[51] Int. Cl.$^2$ ............... H01L 21/265; H01L 21/26
[52] U.S. Cl. ................. 148/1.5; 148/187; 357/23; 357/91
[58] Field of Search ............ 148/1.5, 187; 357/91, 357/23

[56] References Cited

U.S. PATENT DOCUMENTS

| | | | |
|---|---|---|---|
| 3,748,187 | 7/1973 | Aubuchon et al. | 148/1.5 |
| 3,755,001 | 8/1973 | Kooi et al. | 148/1.5 |
| 4,013,484 | 3/1977 | Boleky et al. | 148/1.5 |
| 4,023,195 | 5/1977 | Richman | 357/23 |
| 4,055,444 | 10/1977 | Rao | 148/1.5 |
| 4,069,068 | 1/1978 | Beyer et al. | 148/1.5 |

OTHER PUBLICATIONS

Makris et al., "Forming . . . Geometries . . . I.C.", IBM—Tech. Discl. Bull. 16, (1974), 3240.
Nomura et al., Enhanced Oxidation of Si . . . ", Ion Impl. in S/C (ed) S. Namba, Plenum 1974, 681.
Nagasaki et al., "Gettering Technique . . . ", IBM—TDB, 17 (1975), 3587.
Beyer et al., "Elimination of Stacking Faults", IBM—TDB, 19, 1977, 3051.

Primary Examiner—Arthur J. Steiner
Assistant Examiner—Upendra Roy
Attorney, Agent, or Firm—John G. Graham

[57] ABSTRACT

A method of selectively enhancing the growth rate of silicon oxide in the manufacture of semiconductor devices results in a reduction in encroachment of oxide into the edges of areas masked by silicon nitride. Implanting an impurity material into the monocrystalline silicon surface, without annealing to correct implant damage, causes the surface to oxidize at lower temperatures and faster rates.

6 Claims, 7 Drawing Figures

U.S. Patent  Oct. 9, 1979  4,170,492
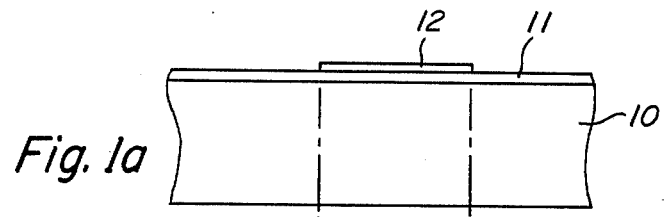
Fig. 1a
Fig. 1b
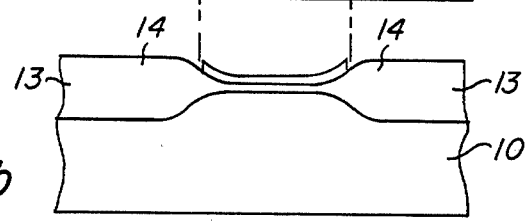
Fig. 2a
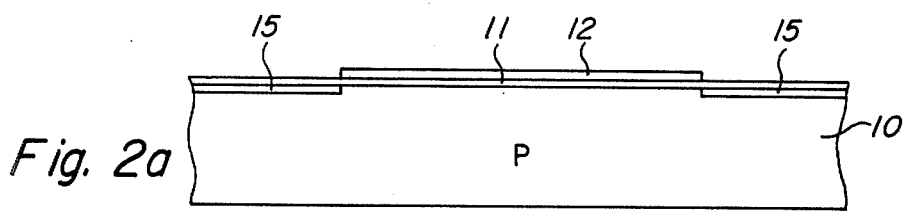
Fig. 2b
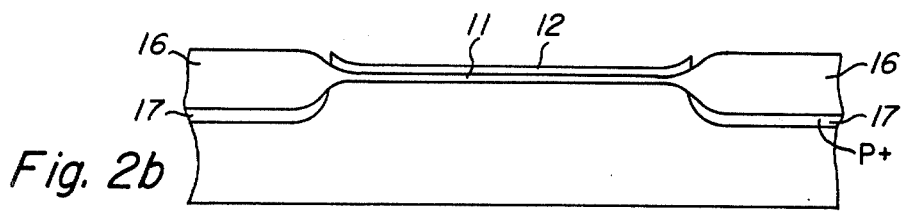
Fig. 2c
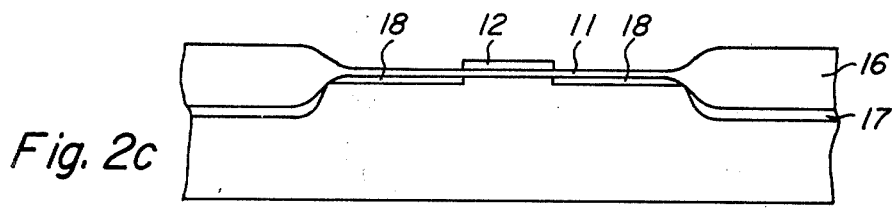
Fig. 2d
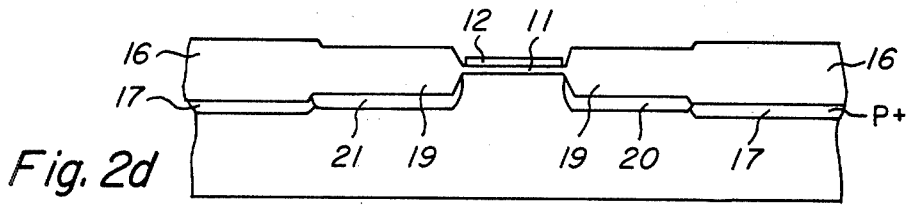
Fig. 2e
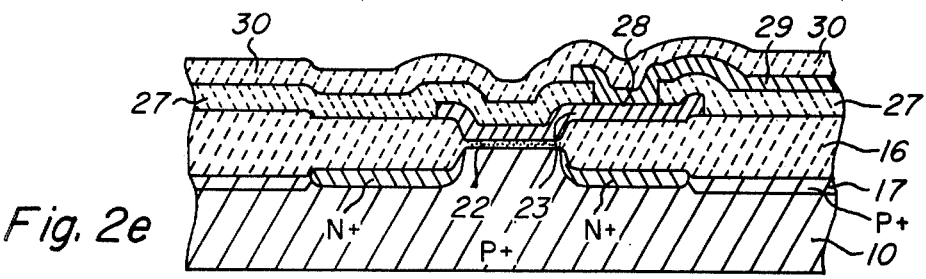

METHOD OF SELECTIVE OXIDATION IN MANUFACTURE OF SEMICONDUCTOR DEVICES

BACKGROUND OF THE INVENTION

This invention relates to methods of manufacture of semiconductor devices, and more particularly to the selective oxidation of a silicon surface in manufacture of such devices.

One of the most widely used methods for making semiconductor integrated circuits today is the N-channel silicon gate self-aligned process for making MOS devices. This process employs an oxidation mask such as silicon nitride to define "moat" areas or to define areas to be surrounded by thick field oxide. The field oxide is usually grown by placing the silicon slices in a tube furnace in an oxidizing atmosphere for many hours at about 1000° C. Aside from the delays in manufacturing caused by the lengthy diffusion steps, the diffusion of oxygen underneath the edges of the mask becomes significant when the slices are maintained at high temperatures for such long time periods. Oxide growth due to this diffused oxygen buckles the mask and renders this portion of the masked area or moat unusable, placing a lower limit on the size of various parts of the integrated circuit. As the component density increases, this limit can become a very important factor. Manufacture of dynamic memory devices having 64K, or 65,536 bits with bar sizes of 35,000 square mils or less may require minimum widths of three microns for these moat areas. However, if the oxide encroachment beneath the mask edges is one micron on each side then one micron left in the center is hardly usable. Accordingly, oxide growth must be in some manner restricted. It has previously been reported that diffusion or implant of impurity in a semiconductor surface affects oxide growth rate; for example, in the manufacture of CMOS devices, the growth rate of gate oxide over N-type channels is greater than that over P-type channels, even though all other conditions are identical. This phenomonena has not been used to reduce the effects of moat encroachment.

It is the principal object of this invention to provide an improved method of selectively oxidizing a surface of a semiconductor device. Another object is to reduce the effect of moat encroachment in the manufacture of N-channel self aligned MOS integrated circuits.

SUMMARY OF THE INVENTION

In accordance with this invention, oxide growth rates on a silicon surface are controlled by selectively implanting impurity and then not annealling out the implant damage. Areas underneath an oxidation mask are of course not implanted. Oxide can then be grown at a much faster rate at a lower temperature, so thick oxide will be produced in the implanted area, but little will grow due to diffusion beneath the edges of the mask.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 1a and 1b are greatly enlarged section views of a small portion of a semiconductor chip showing a selective oxide growth step according to the prior art;

FIGS. 2a-2e are elevation views in section of a transistor in a part of a semiconductor chip at successive stages in the manufacturing process according to the invention.

DETAILED DESCRIPTION OF SPECIFIC EMBODIMENTS

Referring to FIGS. 1a and 1b, an example of moat encroachment in the growth of thick oxide is illustrated. In the manufacture of N-channel silicon gate MOS integrated circuits on a silicon slice 10 moats are defined by first growing a thin layer 11 of thermal oxide, perhaps 1000 Angstroms, then depositing a layer 12 of silicon nitride, also about 1000 Angstroms, and patterning the nitride by a photoresist mask and etch operation. The slice is then placed in a tube furnace in an oxygen atmosphere at about 900 to 1,000° C. for several hours, up to ten or twenty, to grow a thick thermal oxide layer 13, consuming part of the silicon surface so that the original silicon face under the oxide layer 11 and nitride layer 12 will appear as a slightly raised mesa. This is referred to as the moat area on the face of the slice, and it is of course in the moat areas that all of the transisters, capacitors and diffused interconnects are formed. Unfortunately, oxygen will not only diffuse vertically through already-grown oxide to the silicon-to-oxide interface to allow continued growth, but it will also diffuse laterally beneath the edges of the nitride layer 12 in the areas 14 to produce moat encroachment. The vertical thickness of the oxide 13 may be perhaps 10,000 Angstroms, and the lateral extent of the area 14 may be one micron for lengthy oxidizing treatments. If the desired width of the moat, i.e. width of the nitride area 12, is three microns, and the encroachment from either side is one micron, then the effective width after oxide growth is only one micron. Thus it is seen that moat encroachment can provide a lower limit on the design rules or on the narrowest moat area in the manufacture of integrated circuits.

In accordance with the invention, encroachment is minimized by increasing the oxide growth rate by unannealled implant damage. If oxide can be grown faster at lower temperatures, and is enhanced in implant damaged areas, then two factors will reduce encroachment: the fast-growth areas may be selectively defined by implant mask, and further the low temperature and short time of the oxidation treatment will allow less growth beneath the nitride mask.

Referring to FIGS. 2a-2d, a method of making an N-channel silicon-gate transistor according to the invention is illustrated. The starting material is a slice of P-type monocrystalline silicon, typically 3 inches in diameter and twenty mils thick, cut on the -100- plane, of a resistivity of about 6 to 8 ohm-cm. In the FIGS. the portion shown of the bar 10 represents only a very small undivided part of the slice, perhaps 1 or 2 mils wide for each part. After appropriate cleaning, the slice is oxidized by exposing to oxygen in a furnace at an elevated temperature of perhaps 1000 degrees C. to produce the oxide layer 11 over the entire slice of a thickness of about 1000 Angstroms. Parts of this layer 11 may stay in place to become gate insulator areas, but usually the layer is later removed and new gate oxide grown. Next, the layer 12 of silicon nitride of about 1000 Angstroms thickness is formed over the entire slice by exposing to an atmosphere of dichloro silane amd ammonia in a low pressure CVD reactor. A coating of photoresist is applied to the entire top surface of the slice, then exposed to ultraviolet light through a mask which defines the desired pattern of thick field oxide and P+ channel stop, i.e., the moats. The resist is developed, leaving areas where nitride is then etched away by a nitride etchant, removing the exposed part of the nitride layer 12 but leaving in place the oxide layer 11; the nitride etchant does not react with the photoresist.

Using photoresist and nitride as a mask, the slice is now subjected to an ion implant step to produce channel stop regions, whereby boron atoms are introduced into unmasked regions 15 of silicon. The oxide layer 11 is left in place during the implant because it prevents the implanted boron atoms from out-diffusing from the surface during subsequent heat treatment. This boron implant is at a dosage of about $10^{13}$ per sq. cm at 150 KeV. The regions 15 do not exist in the same form in the finished device, because some of this part of the slice will have been consumed in the field oxidation procedure. Usually the slice would be subjected to a 1000 degree C. heat treatment in a nitrogen atmosphere after implant but prior to field oxide growth, as set forth in U.S. Pat. No. 4,055,444, issued to G. R. M. Rao, assigned to Texas Instruments.

The next step in the process is formation of field oxide 16, which is done by subjecting the slices to steam or an oxidizing atmosphere at about 1000 degrees C. for perhaps several hours. This causes a thick field oxide region or layer 16 to be grown as seen in FIGS. 2b. This region extends into the silicon surface because silicon is consumed as it oxidizes. The remaining parts of the nitride layer 12 mask oxidation. The thickness of this layer 16 is about 6000 Angstroms at this point, about half of which is above the original surface and half below. The boron doped P+ regions 15 formed by implant will be partly consumed, but will also diffuse further into the silicon ahead of the oxidation front. Thus, P+ field stop regions 17 will result which will be much deeper than the original regions 15. At this point, the field oxide layer 16 is not as thick as it will be in the finished device. Some additional thickness results from subsequent heat treatments.

The slice is now coated with another photoresist layer and then exposed to ultraviolet light through a mask which defines the source and drain areas for transistors as well as interconnect lines which are to be N+ diffused. After developing the resist, the slice is again subjected to a nitride etchant which removes the parts of the nitride layer 12 now exposed by holes in the photoresist. An arsenic implant produces N+ regions 18 which will subsequently provide the sources, drains, etc. The oxide layer 11 would be left in place as before. An anneal step is not used before the subsequent oxidation, as this would remove the implant damage. Alternatively, it may be preferable to remove the oxide 11 where the arsenic is to be implanted, so that a higher percentage of the implanted arsenic ions will be in the silicon surface rather than the oxide. According to the invention, referring to FIG. 2c, a second field oxidation step is now performed by placing the slice in steam or dry oxygen at about 800 degrees C. for about one-half hour. This oxidizes all of the top of the slice not covered by the remaining parts of the nitride layer 12, producing field oxide 19 which is about 6000 Angstroms thickness. During this oxidation, the areas of field oxide 16 grow slightly thicker. The N+ regions 18 are partly consumed but also diffuse further into the silicon ahead of the oxidation front to create heavily doped source and drain regions 20 and 21.

Next the remaining nitride layer 12 is removed by an etchant which attacks nitride but not silicon oxide, then the oxide 11 is removed by etching and the exposed silicon cleaned. The gate oxide 22 is grown by thermal oxidation to a thickness of about 500 to 800 Angstroms. In areas of the slice where depletion load devices are required, although not pertinent to this invention, a masked ion implant step would be done at this point. Likewise, the threshold voltage of enhancement mode transistors may be adjusted by ion implant. Also, windows for polysilicon to silicon contacts, if needed, are patterned and etched at this point using photoresist; none are needed in transistor shown.

As seen in FIG. 2e a layer 23 of polycrystalline silicon is deposited over the entire slice in a reactor using standard techniques to a thickness of about 5,000 Angstroms. This layer is doped with phosphorous by the later N+ diffusion to make it highly conductive. The polysilicon layer 23 is patterned by a photoresist operation. The polycrystalline silicon remaining on the slice provides what will be the gate of N-channel MOS transistor, as well as other gates and interconnections.

If no subsequent N+ diffusions are to be made, the polysilicon is implanted or diffused just after deposition and before patterning to make it highly conductive.

Interlevel oxide 27 is deposited and patterned to leave holes such as contact area 28 for metal-to-poly contacts, then an aluminum film is deposited over the entire slice and patterned to leave interconnections such as the strip 29. A protective overcoat 30, usually a low temperature oxide or glaze is added, then the slice is scribed and broken into individual bars, each containing a complete integrated circuit with perhaps fifty or a hundred thousand transistors or components, and the bars are mounted in packages.

It is important that the step of implanting the regions 18 be done in such a way as to enhance subsequent oxide growth. Data shows that for arsenic implant dosages of $3 \times 10^{16}$ at 50 KeV, the total oxide thickness is virtually independent of temperatures from about 800° C. to 1100° C. In contrast, for the same conditions for unimplanted silicon, the oxide growth in 100 minutes in steam would be less than 600 Angstroms at 800° C. and 8,000 Angstroms at 1100° C. At higher temperatures, the implant damage is annealed out during oxidation so there is little enhancement. That is, the limiting oxide thickness is almost linearly related to implant dosage in the $10^{14}$ to $10^{16}$ range. Another unexpected phenomona is that at 800° C., the total oxide growth is inversely related to the implant energy over the range of 25 KeV to 200 KeV. It might be expected that higher energy would cause a deeper and thicker damage region and hence an increased oxide enhancement. Instead, increased enhancement appears to occur at lower energies. For temperatures of 900 to 1100, the total or limiting oxide is almost independent of the implant energy. So the optimum appears to be oxidation below 900° C., without anneal, using an implant of over $10^{16}$ dosage at below 50 KEV.

In place of arsenic, other materials may be used as the implant impurity. If the conductivity type is not be changed, then an inert material would be used such as krypton, or possibly oxygen.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of growing a silicon oxide coating on selected areas of a face of a silicon body comprising the steps of applying an oxidation mask of predetermined shape to said face, implanting an impurity material into said selected areas of said face, but not through the oxidation mask, then oxidizing the face at a low temperature of at least about 800 Degrees C. and no more than about 900 Degrees C. and for a short time of less than two hours without annealing the crystalline damage caused by the implant, the implanted impurity causing oxide growth in said selected areas at an enhanced rate compared to that beneath the oxidation mask, thereby minimizing lateral encroachment of oxide growth beneath the edges of the oxidation mask.

2. A method according to claim 1 wherein the oxidation mask is silicon nitride.

3. A method according to claim 1 wherein the impurity material is arsenic.

4. A method according to claim 1 wherein the impurity material is a conductivity-type determining impurity in silicon.

5. A method of making an insulated gate field effect transistor comprising the steps of applying a first oxidation mask to a part of a face of a silicon body, oxidizing said face to grow thick field oxide where the face is not covered by the mask, forming a second oxidation mask over only a portion of said part to provide a channel area, subjecting said face to an ion implant of conductivity determining impurity atoms which enhance the rate of oxide growth, the second oxidation mask also masking said implant, growing oxide on said face at a temperature of at least about 800 Degrees C. and not more than about 200 Degrees C. to produce an oxide coating over impurity doped source and drain regions in said surface, the implanted impurity causing oxide growth in said selected areas at an enhanced rate compared to that beneath the oxidation mask, thereby minimizing lateral encroachment of oxide growth beneath the edges of the oxidation mask.

6. A method according to claim 5 wherein the impurity is arsenic.

* * * * *